(12) United States Patent
Goodwin et al.

(10) Patent No.: US 6,331,023 B1
(45) Date of Patent: Dec. 18, 2001

(54) GRIDDED SUBSTRATE TRANSPORT SPATULA

(75) Inventors: Dennis Goodwin, Happy Jack, AZ (US); Gerben O. Vrijburg, Zandvoort (NL)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/483,604

(22) Filed: Jan. 14, 2000

(51) Int. Cl.[7] .............................. B25J 15/00; B65G 49/07
(52) U.S. Cl. ......................... 294/1.1; 294/902; 414/935; 901/30
(58) Field of Search .................... 294/1.1, 7, 32, 294/49, 64.1, 64.3, 86.4, 902; 118/500, 503; 209/419; 414/935, 939, 941; 901/31, 40

(56) References Cited

U.S. PATENT DOCUMENTS

| | | | |
|---|---|---|---|
| 2,326,962 | * | 8/1943 | Meier ............................. 294/902 X |
| 3,256,548 | * | 6/1966 | Peterson ........................... 294/7 X |
| 3,934,915 | * | 1/1976 | Humpa ............................. 294/902 X |
| 4,767,142 | * | 8/1988 | Takahashi et al. ................. 294/64.1 |
| 4,937,942 | * | 7/1990 | Skerker et al. ..................... 294/7 X |
| 5,580,112 | * | 12/1996 | Lin et al. ........................ 294/64.1 |
| 5,857,667 | * | 1/1999 | Lee ............................. 294/64.1 X |
| 5,911,461 | * | 6/1999 | Sauter et al. ....................... 294/1.1 |
| 5,984,391 | * | 11/1999 | Vanderpot et al. .................. 294/1.1 |

FOREIGN PATENT DOCUMENTS

| 70817 | * | 5/1942 | (CS) | ......................................... 294/7 |
|---|---|---|---|---|
| 254437 | * | 11/1986 | (JP) | ..................................... 294/64.3 |

* cited by examiner

*Primary Examiner*—Johnny D. Cherry
(74) *Attorney, Agent, or Firm*—Knobbe, Martens, Olson & Bear, LLP

(57) ABSTRACT

A transport assembly that supports a substrate and controllably moves the substrate within a semiconductor processing system in a manner that reduces the likelihood of the substrate being damaged. The assembly includes a spatula having an uneven upper surface that contacts the substrate. The spatula upper surface includes a plurality of protrusions that form peaks and a plurality of valleys between the peaks. Each of the peaks contacts the lower surface of the substrate so as to distribute the pressure exerted by the spatula on the substrate. A network of channels is created between the lower surface of the substrate and the valleys of the spatula that enables gas to readily flow therethrough. The channels extend to openings along the sides of the spatula to communicate the channels with neighboring space. Entrapped pockets of heated gas are inhibited from forming underneath the substrate, and the substrate can be easily lifted off of the spatula.

17 Claims, 5 Drawing Sheets

GRIDDED SUBSTRATE TRANSPORT SPATULA

BACKGROUND OF THE INVENTION

1. Field of the Invention

The present invention relates to semiconductor wafer or substrate handling systems and in particular relates to substrate transport spatulas.

2. Description of the Related Art

Integrated circuits which are typically comprised of many semiconductor devices, such as transistors, diodes, and resistors, are often fabricated oil a thin slice of semiconductor material, otherwise known as a wafer. These semiconductor devices are often formed in the wafer in a process that involves raising the temperature of the wafer, depositing layers of material on the wafer, exposing the wafer to doping atoms, and removing portions of material from the wafer so as to selectively form the wafer into a preferred configuration. Consequently, when forming such integrated circuits, it is often necessary to remove the wafer from one processing chamber and reposition the wafer into another processing chamber, while the wafer is at a high temperature state. However, since the wafer is extremely brittle and sensitive to external forces, great care must be taken so as to avoid physically damaging the wafer while it is being transported.

To avoid damaging the wafer during the transport process, wafer transport spatulas are often used. In particular, such spatulas support the wafer by contacting a lower surface of the wafer with an upper surface of the spatula. Furthermore, frictional forces acting therebetween enable the spatula to move the wafer so that the wafer can be repositioned in a manner that prevents the wafer from moving with respect to the spatula.

One type of spatula has a flat upper surface to support the wafer so that the upward force that supports the wafer is distributed somewhat uniformly over the surface of the wafer contacted by the spatula. Thus, the upward pressure that is exerted onto the lower surface of the wafer by the flat spatula is relatively small. Consequently, the reduced pressure applied by the flat spatula onto the wafer inhibits the flat spatula from forming scratches along the lower surface of the wafer while the wafer is supported by the spatula and while the wafer is accelerated by the spatula.

However, flat spatulas have several problems. In particular, entrapped pockets of hot gas are sometimes formed between the flat lower surface of the wafer and the flat upper surface of the spatula, thereby compromising the frictional engagement between the wafer and the spatula. In particular, it is possible for a small enclosed space to be formed between the wafer and the spatula due to either the upper surface of the spatula or the lower surface of the wafer having a slightly concave shape. Furthermore, if the wafer is in a high temperature state, a gas which is confined within the small space will likely heat up and attempt to expand in volume. Consequently, the expanding heated gas will exert an upward force so as to reduce the degree of contact between the upper surface of the spatula and the wafer. Thus, it is possible that the wafer will slide along the upper surface of the spatula while the spatula is moved, which can lead to scratching of the lower surface of the wafer or can even result in the wafer being dropped during movement.

Another problem with flat spatulas is that it is sometimes difficult to remove the wafer from the spatula. In particular, when an external force is applied onto the wafer so as to raise the wafer off of the spatula, a narrow evacuation space is initially created between the wafer and the spatula. However, since the lower surface of the wafer and the upper surface of the spatula are substantially flat and since the resulting distance between the wafer and the spatula is relatively small, surrounding air may not readily flow into the narrow space between the wafer and the spatula. As a result, a region of low air pressure can also sometimes be produced along the lower surface of the wafer. Hence, the air pressure along the upper surface of the wafer can sometimes be much larger than the air pressure along the lower surface of the wafer, thereby requiring an upward lifting force that is substantially greater than the weight of the wafer to remove the wafer from the spatula. It is possible that the required lifting force will damage the wafer or will cause inefficiencies in the manufacturing process.

Another type of spatula known in the art, otherwise referred to as the minimally contacting spatula in this application, has been developed to address the problems of the flat spatula. In particular, the minimally contacting spatula comprises several pins that upwardly extend above the spatula. Furthermore, the minimally contacting spatula engages the wafer by contacting the pins with the lower surface of the wafer so that each of the pins supports the wafer on an equal basis. Consequently, it is important that the pins be precisely aligned in a vertical manner so as to securely engage the wafer with the minimally contacting spatula.

Typically, the minimally contacting spatula employs only three pins. Three is the minimum number of point forces that are required to Support the wafer in a state of static equilibrium, and it is difficult to vertically align more than three pins. Since the flat lower surface of the wafer is not in contact with a broad external flat surface, entrapped pockets of gas are inhibited from forming along the lower surface of the wafer. When lifting the wafer off of the three pins, surrounding gas can readily flow underneath the wafer so as to enable the wafer to be lifted with a force that is only marginally greater than the weight of the wafer.

However, minimally contacting spatulas have several problems. In particular, since the minimally contacting spatula typically contacts the wafer at only three small regions of the lower surface of the wafer, the pressure exerted on the lower surface of the wafer is relatively large at the three regions of contact. Thus, it is possible that the increased pressure exerted on the lower surface of the wafer will damage the lower surface of the wafer. Furthermore, to limit the damage caused by the minimally contacting spatula, it is often necessary to move the wafer at a relatively low rate.

From the foregoing, it will therefore be appreciated that there is a need for an improved wafer transport spatula that operates more effectively than known flat spatulas and known minimally contacting spatulas. In particular, there is a need for an improved spatula that provides sufficient frictional engagement of the wafer so as to enable the wafer to be moved at a more desirable rate and is capable of supporting the wafer in a manner that does not substantially damage the lower surface of the wafer.

SUMMARY OF THE INVENTION

The aforementioned needs are satisfied by the wafer spatula of the present invention that defines an upper surface having a plurality of uniformly distributed protrusions extending upwardly from a plurality of intersecting channels. These protrusions uniformly support the substrate while the channels allow gas to flow adjacent the lower surface of the substrate.

Stated differently, the spatula comprises an upper uneven surface that includes a plurality of peaks that contact a lower surface of the substrate to collectively apply a force onto the substrate that is capable of supporting and moving the wafer in a manner that reduces the likelihood of the lower surface of the wafer being damaged. The uneven surface further includes a plurality of valleys that enable gas to flow between the wafer and the valleys.

The plurality of trenches also forms the upper surface with a network of channels that enable a gas to readily flow therethrough. This prevents the formation of entrapped gas pockets between the wafer and the spatula and enables gas to freely flow toward a lower surface of the substrate so that it can be lifted off the spatula with a force which is marginally greater than the weight of the substrate. To further facilitate the gas flow, vent holes can be provided extending through the spatula.

In another alternative, the bottom surface of the spatula may be formed with a surface like that of the upper surface to minimize the possibility of warpage.

From the foregoing, it should be apparent that the spatula of the present invention is capable of supporting and moving a wafer or other substrate in a manner that results in the wafer experiencing less damage to its lower surface and in a manner that enables the wafer to be lifted off of the wafer spatula with a reasonable force. These and other objects and advantages of the present invention will become more apparent from the following description taken in conjunction with the accompanying drawings.

DETAILED DESCRIPTION OF THE PREFERRED EMBODIMENT

Figure 1:
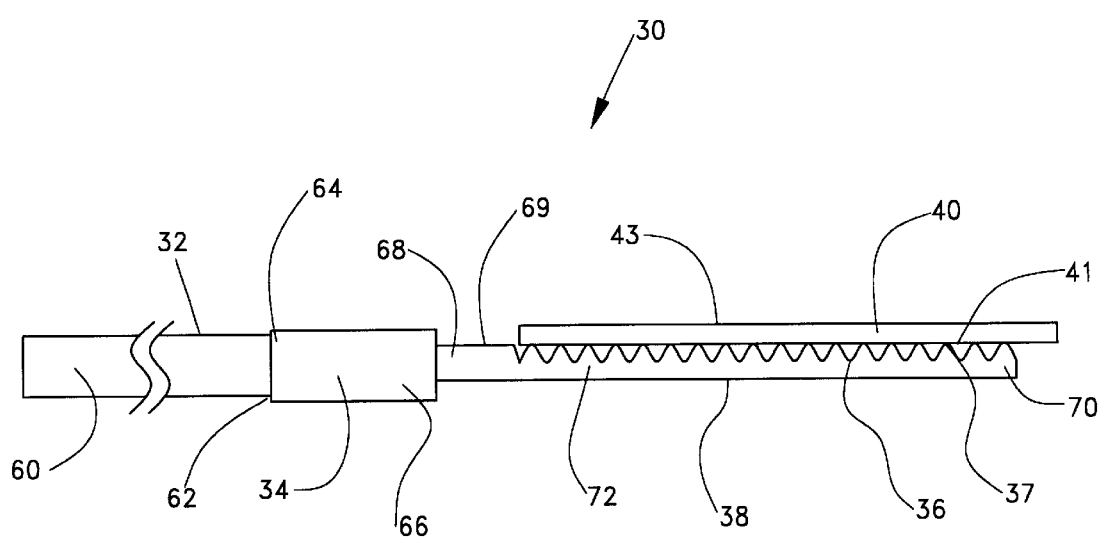
FIG. 1 is a side elevational view of the wafer transport assembly of the present invention illustrating an improved spatula engaged with a semiconductor wafer.

Reference will now be made to the drawings wherein like numerals refer to like parts throughout. In particular, FIG. 1 generally illustrates a semiconductor wafer transport assembly 30 that is adapted to controllably move a wafer 40 within a semiconductor processing system. Specifically, a flat lower surface 41 of the wafer is positioned on an upper surface 37 of the spatula 36. The spatula 36 includes a plurality of protrusions 39 that form the upper surface 37 with an uneven contour so as to enable the wafer 40 to be supported and accelerated by the spatula 36 in a maimer which is more effective than that of wafer spatulas known in the art.

As shown in FIG. 1, the wafer transport assembly 30 is comprised of a robotic arm 32, a spatula holder 34, and the spatula 36. The robotic arm 32 includes a rear end 60 that mounts to a support member of the semiconductor processing system and a forward end 62 that can be controllably displaced in a well known manner. The spatula holder 34 includes a first end 64 that attaches to the forward end 62 of the robotic arm 32 in a known manner so as to controllably move the spatula holder 34 and a second end 66 that attaches to the spatula 36 in a known maimer.

The spatula 36 includes an inner end 68 suitably shaped to be securely engaged with the second end 66 of the spatula holder 34. Thus, when engaged by the spatula holder 34, the spatula 36 can be controllably moved by the robotic arm 32.

As shown in FIG. 1, the spatula 36 includes an outer side or end 70, the uneven contoured upper surface 37 and a planar lower surface 38. The distance between the inner end 68 and the outer end 70 defines the length of the spatula 36 and the distance between the lower surface 38 and the upper surface 37 defines the thickness of the spatula 36. The spatula 36 is preferably oriented so that the plane of its upper surface is substantially aligned horizontally.

Figure 2:
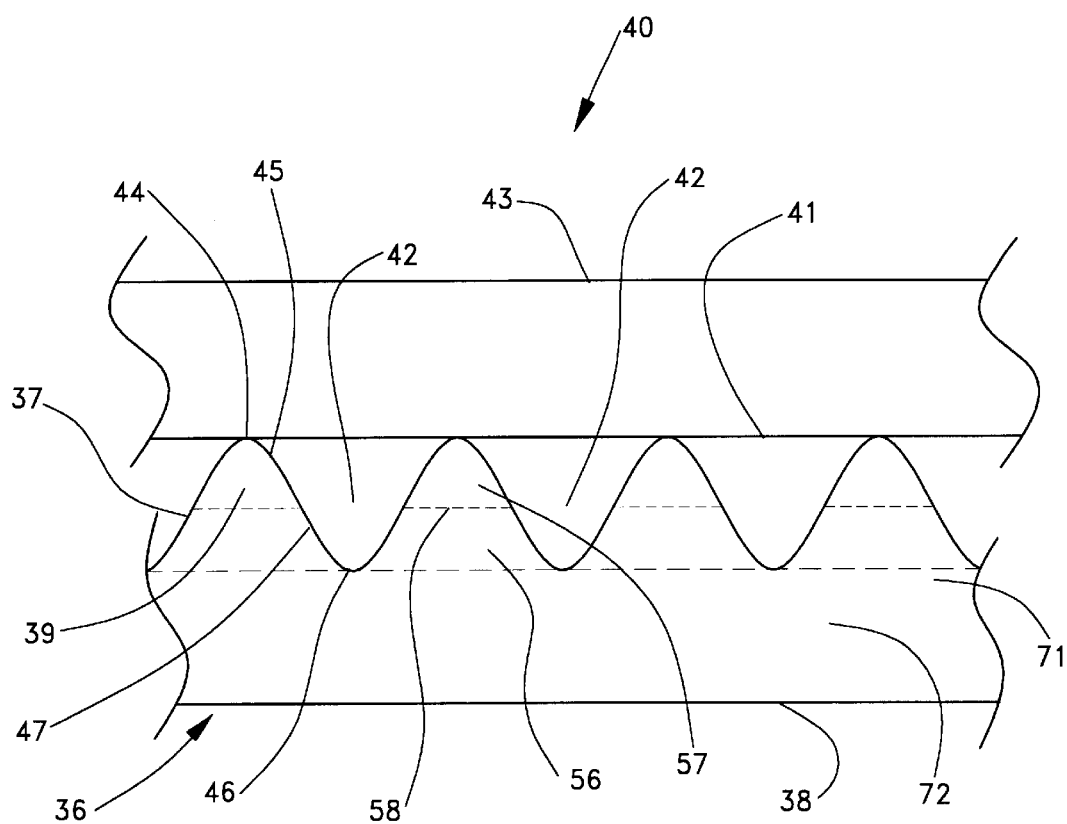
FIG. 2 is a magnified side elevational view of FIG. 1 illustrating the wafer spatula in greater detail.

Referring now to FIG. 2, the spatula 36 comprises a flat wall section 72 and the plurality of protrusions 39 that extend from the wall section 72. Specifically, the flat wall section 72 is bounded from below by the lower exposed surface 38 of the spatula 36 and bounded from above by a planar upper boundary, represented by the dashed line 71, that is substantially parallel to the lower surface 38. Each of the protrusions 39 extends from the upper boundary 71 of the wall section 72 along a direction that is substantially perpendicular to the upper boundary 71.

Each of the protrusions 39 includes a lower section 56 and an upper section 57. In particular the lower section 56 outwardly extends from the upper boundary 71 of the wall section 72 to a planar midlevel boundary, represented by the dashed line 58, that is parallel with the upper boundary 71 and positioned outwardly from the upper boundary 71 at a height which is approximately equal to one half of the height of each of the protrusions 39. The upper section 57 extends upward from the midlevel boundary 58, so as to form each of the protrusions 39 with a substantially convex shape. Each of the protrusions 39 is formed in a substantially identical maimer so that a peak 44 of each of the protrusions 39 is at the same height above the upper boundary 71. The peaks 44 are preferably rounded and polished so that the protrusions 39 are substantially devoid of sharp features.

As shown in FIG. 2, the upper surface 37 of the spatula is comprised of a plurality of raised surfaces 45 and a plurality of lowered surfaces 47. Each of the raised surfaces 45 is positioned above the midlevel boundary 58 and each of the lowered surfaces 47 is positioned between the boundary 71 and the boundary 58. Further, the raised surfaces 45 include the peaks 44 of the protrusions 39 and the lowered surfaces 47 include the valleys 46 in between each of the protrusions 39.

The protrusions 39 provide the spatula 36 with the upper surface 37 that comprises the horizontally aligned peaks 44 that are each tangent to a common plane which is parallel to the wall section 72 of the spatula 36. Thus, the wafer 40 is able to be supported by the spatula 36 such that each of the peaks 44 of the spatula 36 contacts a different portion of the planar lower surface 41 of the wafer 40 so as to uniformly distribute the load bearing forces across the lower surface 41 when the wafer 40 is positioned on the spatula 36. Consequently, the spatula 36 is able to support the wafer 40 so that the pressure exerted onto the lower surface 41 by the spatula 36 is reduced.

As shown in FIG. 2, the protrusions 39 also provide the upper surface 37 of the spatula 36 with the plurality of valleys 46 that are formed between the protrusions 39. Consequently, when the wafer 40 is supported by the spatula 36, a network of channels 42 is formed between the valleys 46 of the upper surface 37 of the spatula 36 and the lower surface 41 of the wafer 42 which extend along the length and width of the wafer spatula and enable a gas to freely flow therethrough as will be described in greater detail below.

Figure 3:
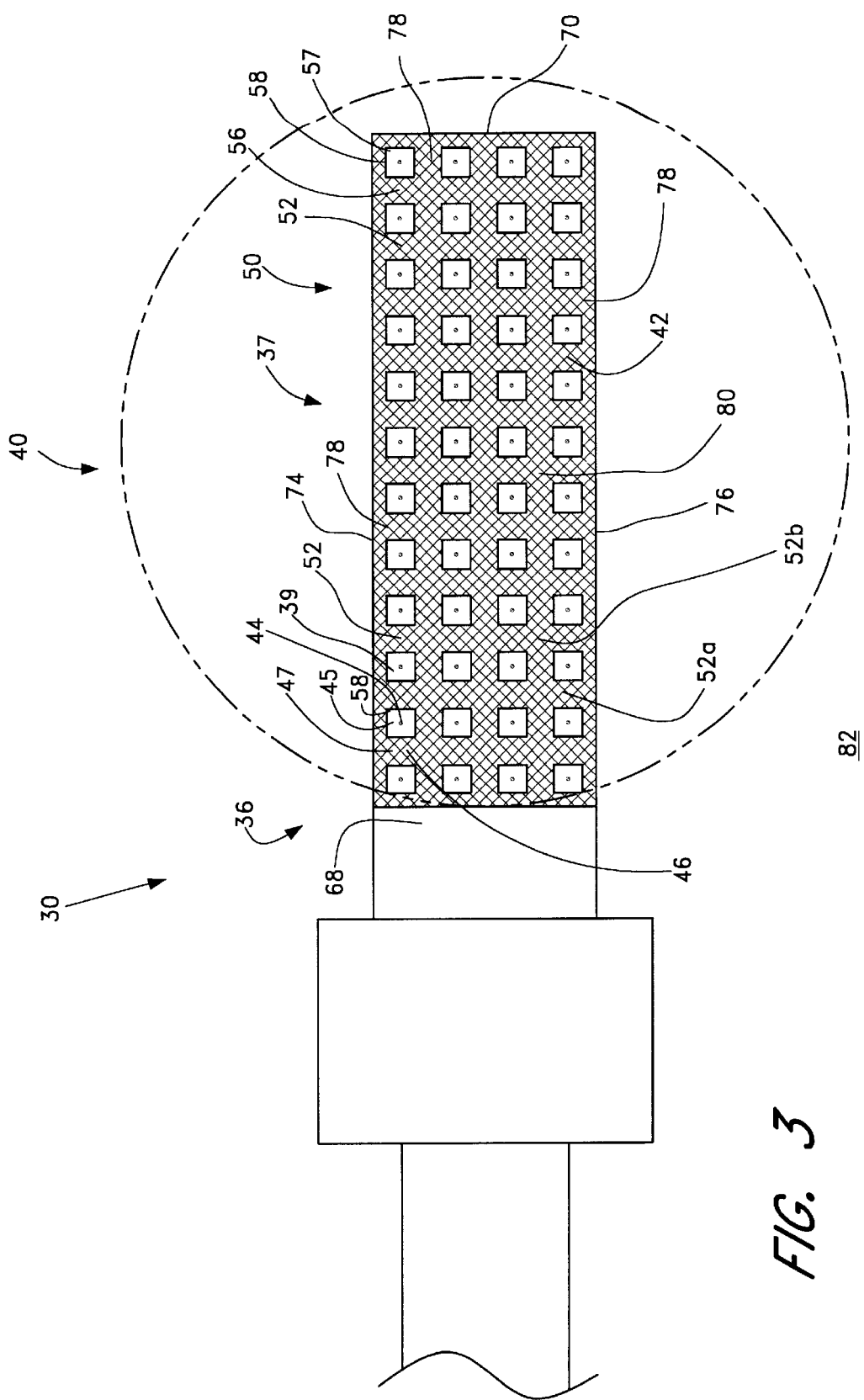
FIG. 3 is a top plan view of the transport assembly of FIG. 1.

Referring to FIG. 3, the spatula 36, in the preferred embodiment, is formed with a rectangular shape having elongated sides 74 and 76 that define the length of the spatula 36, and the distance between the sides 74 and 76 defines the width of the spatula 36. The sides 74 and 76 are substantially perpendicular to the outer side 70. However, it will be appreciated that the spatula 36 could be formed with a non-rectangular shape without departing from the present invention. For example, the spatula 36 could have a forked shape. Further, although the spatula 36 of FIG. 3 is illustrated with a width that is less than the diameter of the wafer 42, the width of the spatula 36 could be greater than the diameter of the wafer 40.

As shown in FIG. 3, the protrusions 39 are formed along the upper surface 37 of the spatula 36 so as to be uniformly distributed in a grid pattern 50. The lowered surfaces 47 are shown by the presence of a hatch pattern and the raised surfaces 45 are shown by an absence of the hatch pattern. The grid pattern 50 comprises a plurality of trenches 52 that extend along the upper surface 37 of the spatula. The bottoms of the trenches 52 form the valleys 46 between the protrusions 39, and the tops of the trenches 52 form the peaks 44 of the protrusions 39.

In a preferred embodiment, the trenches 52 are comprised of a plurality of lateral trenches 52a that extend between the sides 74 and 76 and a plurality of longitudinal trenches 52b that extend between the inner end 68 and the outer end 70 of the spatula 36, wherein the trenches 52a intersect with the trenches 52b at a plurality of intersection regions 80, as shown in FIG. 3. Consequently, the network of channels 42 formed between the spatula 36 and the wafer 40 are multiply interconnected so as to enable a gas to readily flow through the channels 42. The perpendicular relationship between the trenches 52a and the trenches 52b provides each of midlevel boundaries 58 between the lower and upper sections 56 and 57 of each of the protrusions 39 with a generally square crosssectional shape. The channels 42 extend to a plurality of openings 78 adjacent the side surfaces 70, 74, and 76 of the spatula 36 so as to enable surrounding gas in a neighboring space 82 to readily flow into and out of the network of channels 42. The channels 42 help to maintain increased frictional forces applied on the wafer 40 by the spatula 36 and enable the wafer 40 to be removed from the spatula 36 with a reduced lifting force.

Although the preferred embodiment includes the grid pattern 50 which comprises the two sets of trenches 52a and 52b that combine to form the midlevel boundary 58 of each of the protrusions 39 with the square shape, the spatula 36 could be formed with the plurality of protrusions 39 having an alternatively shaped midlevel boundary 58. For example, the plurality of trenches 52 could comprise three sets of trenches that form the midlevel boundary 58 of each of the protrusions 39 with a hexagonal shape. In another embodiment, the plurality of trenches 52 could comprise four sets of trenches that form the midlevel boundary 58 of each of the protrusions 39 with an octagonal shape.

It will be appreciated that the spatula 36 solves the previously mentioned problems associated with prior art wafer spatulas. In particular, although each of the protrusions 39 of the spatula 36 contacts a relatively small area of the lower surface 41 of the wafer 40, the large number of protrusions 39 in contact with the wafer 40 results in a relatively small pressure exerted by the spatula 36 onto the wafer 40. Moreover, since the peaks 44 of the protrusions 39 are contoured with a dull convex shape, the pressure exerted by each of the protrusions 39 of the spatula 36 onto the lower surface 41 of the wafer 40 is substantially uniform. Consequently, the likelihood of the spatula 36 damaging the lower surface 41 of the wafer 40 is reduced.

Other advantages provided by the spatula 36 are that the area of each of the peaks 44 of the protrusions 39 which contact the lower surface 41 of the wafer 40 is relatively small and that the network of channels 42 formed between the spatula 36 and the wafer 40 enable a gas to freely pass therethrough. The relatively small area of the peaks 44 of the protrusions 39 reduces the likelihood of enclosed spaces being formed between the peaks 44 and the lower surface 41 of the wafer 40. Furthermore, if the temperature of a gas that fills the channels 42 is heated, the gas will expand through the openings 78 of the channels 42, thereby preventing the heated gas from applying an upward force on the wafer 40. Thus, enclosed pockets of heated gas that could apply upward forces on the wafer are inhibited from forming, thereby maintaining a preferred frictional engagement between the wafer 40 and the spatula 36. Consequently, the spatula 36 is able to effectively move the wafer 40 at an increased rate.

Another advantage provided by the spatula 36 is that the wafer 40 can be removed from the spatula 36 with a modest force. In particular, as the wafer 40 is initially lifted from the spatula 36, the network of channels 42 enable surrounding gas to readily flow into an evacuation space created by the initial movement of the wafer 40. Thus, the gas pressure along the lower surface 41 of the wafer 40 is able to rapidly equalize with the gas pressure along the upper surface 43 of the wafer 40. Consequently, the wafer 40 can be lifted off of the spatula 36 with a force which is only marginally greater than the weight of the wafer 40.

Figure 4:
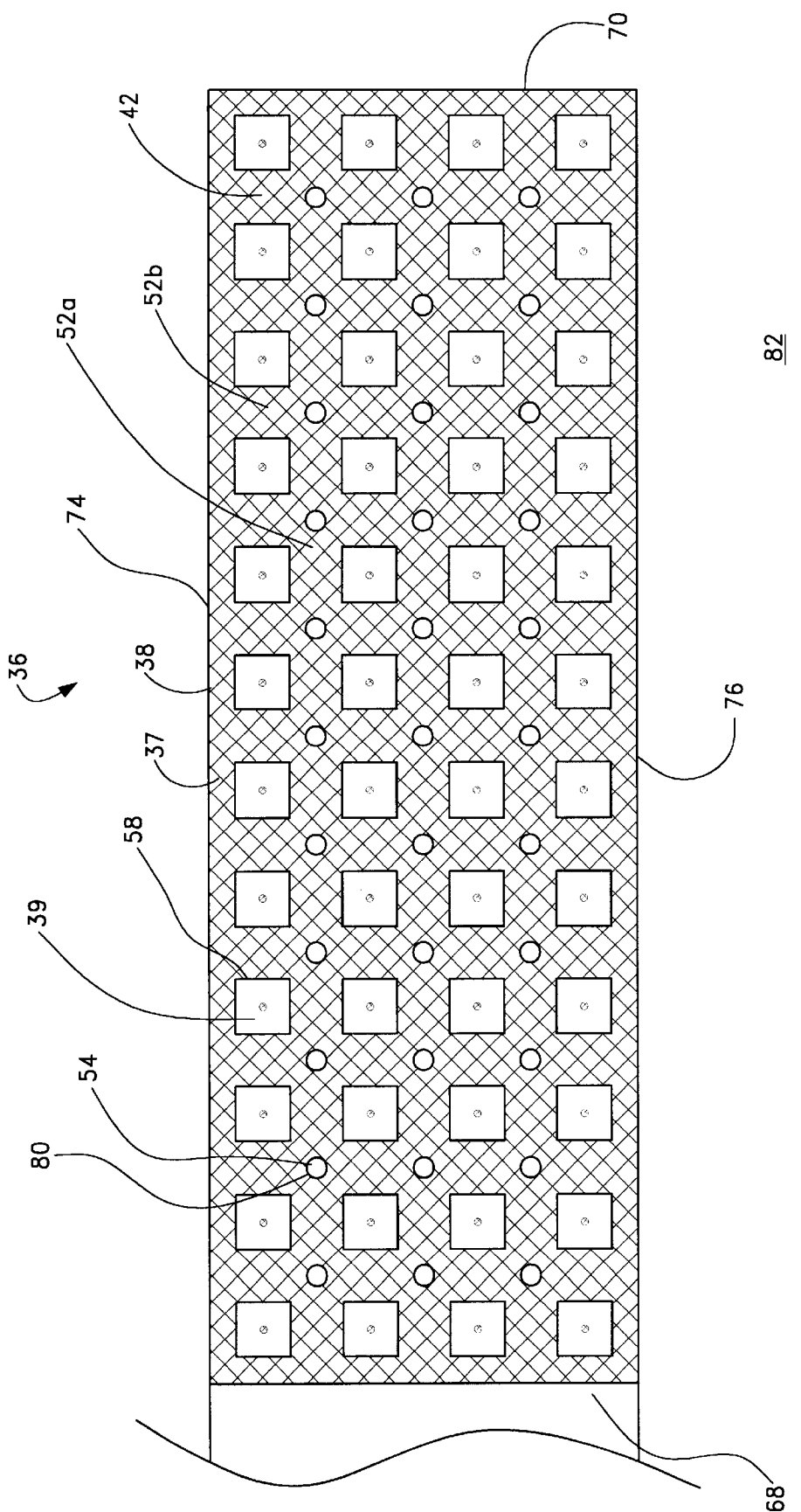
FIG. 4 is a top plan view of an embodiment of the spatula of the present invention which includes a plurality of gas vent holes.

In one embodiment, the spatula 36 further comprises a plurality of gas vent holes 54 that communicate the network of channels 42 with the space 82 adjacent the lower surface 38 of the spatula 36, as shown in FIG. 4. Each of the holes 54 extends from the spatula upper surface 37 to the lower surface 38, and is located at each of the intersection regions 80, displaced from the peaks of the protrusions 39. Consequently, the holes 54 enable surrounding gas from the neighboring space 82 to more easily flow into and out of the network of channels 42.

The spatula 36 is preferably manufactured from quartz so as to enable it to engage the wafer 40 at high temperatures, but of course, other suitable materials may be employed. While the spatula may be made of various thicknesses, it preferably is no more than about 2.5 mm. Preferably, the centers of adjacent trenches 52a and 52b are separated by a distance of about 1 mm, and the protrusions 39 extend above the upper boundary 71 of the wall section 72 by a distance of about 0.5 mm. In one embodiment, the spatula 36 is fabricated so that the plurality of protrusions 39 are formed with a density of over 600 protrusions per square inch. Thus, a spatula, say one inch by four would have over 2000 protrusions or peaks.

The upper surface 37 of the spatula 36 may be formed in an inexpensive manner by grinding the initially flat upper surface 37 of a planar piece of quartz material with a grinding tool known in the art so as to form the trenches 52 so that the unground portions of the surface 37 form the peaks 44 and the ground portions form the valleys 46. The trenches 52 are formed with a depth that ultimately provides the network of channels 42 with appropriate dimensions for allowing a gas to readily flow therethrough. Additionally, the peaks 44 may be smoothly contoured into a concave shape by flame polishing and mechanically polishing the protrusions 39 so as to round off any edges created during the grinding process. The valleys 46 of the upper surface 37 may be further contoured by chemically polishing the interior regions of the trenches 52 with hydrofluoric acid.

Figure 5:
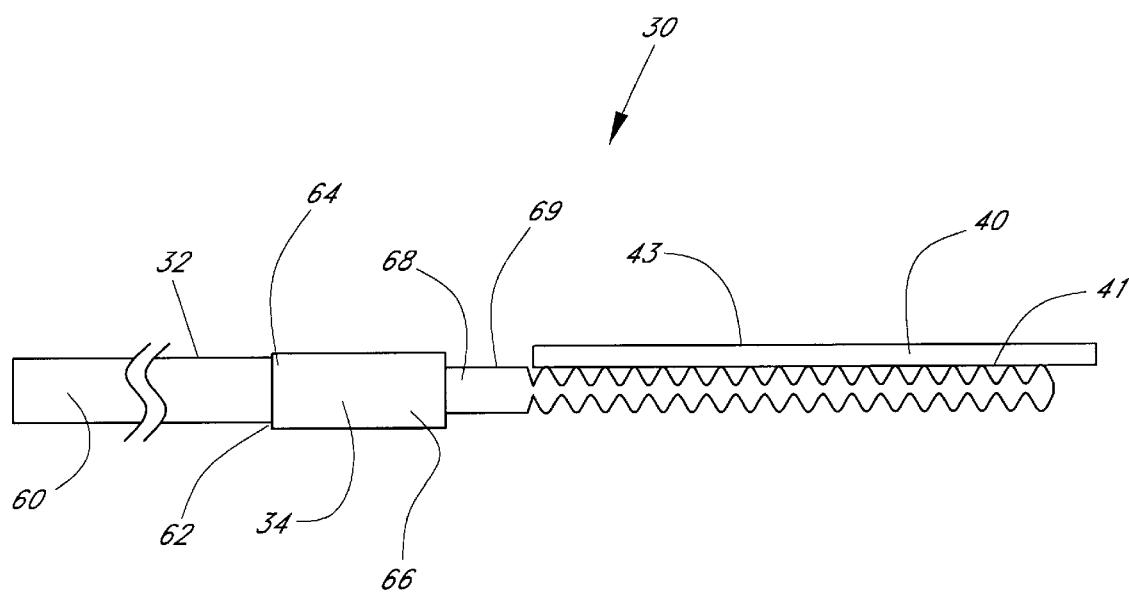
FIG. 5 is a side elevational view of the spatula of FIG. 1 having a lower surface substantially similar to the upper surface.

In one embodiment, the lower surface 38 of the spatula may be substantially similar to the upper surface 37 so as to prevent the spatula 36 from warping, as shown in FIG. 5. In particular, when the temperature of the spatula 36 is changed, the symmetrical shape of the spatula 36 provided by the similar upper and lower surfaces 37 and 38 will inhibit the spatula 36 from warping due to the absence of asymmetrical thermal stresses.

Although the preferred embodiment of the present invention illustrates the fundamental novel features of the invention, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appending claims.

What is claimed is:

1. In a substrate processing system, a substrate transport assembly comprising:
    a robotic arm having a rear end that mounts to a support member of a substrate processing system and a forward end that can be controllably displaced to move a substrate;
    a spatula holder secured to said robotic arm; and
    a spatula having a rear end connected to a forward end of said spatula holder so that the spatula can be controllably moved by the robotic arm, said spatula comprising an element having an upper surface with a plurality of intersecting channels and a plurality of uniformly distributed protrusions extending upwardly from the channels, said protrusions being arranged so that a substrate can be positioned on the spatula with the lower surface of the substrate uniformly supported by the protrusions and with the channels being open to outer edges of the element to allow gas to flow adjacent the lower surface of the substrate to facilitate separating the substrate from the spatula.

2. The spatula of claim 1, wherein the protrusions are arranged to have a density of at least 600 per square inch.

3. The spatula of claim 1, wherein the element is quartz.

4. The spatula of claim 1, wherein the spatula has a maximum thickness of about 2.5 mm.

5. The spatula of claim 1, wherein the plurality of intersecting channels comprise a first plurality of generally parallel channels and a second plurality of generally parallel channels that intersect the first plurality of channels.

6. The spatula of claim 5, wherein the first plurality comprises at least three channels, and wherein the second plurality of channels comprises at least three channels.

7. The spatula of claim 1, comprising a plurality of holes extending between said upper surface and a lower surface.

8. A spatula to be attached to a movable holder for supporting and transporting a substrate, the spatula comprising:
    a first end that attaches to the movable holder; and
    an upper uneven surface that includes a plurality of peaks that contact a lower surface of the substrate to collectively apply a force onto the lower surface of the substrate that is capable of supporting and moving the substrate, the uneven surface further includes a plurality of valleys that enable gas to flow between the lower surface of the substrate and a surrounding space, and the plurality of peaks comprises at least 2000 peaks.

9. The spatula of claim 8, wherein the uneven surface includes a plurality of trenches, and the bottom of the trenches form the plurality of valleys, and the top of the trenches form the plurality of peaks.

10. The spatula of claim 9, wherein each of the peaks is polished to form a dull shape.

11. The spatula of claim 10, wherein the trenches extend in a linear manner.

12. The spatula of claim 11, wherein the trenches intersect to form a plurality of intersection regions.

13. The spatula of claim 9, wherein the plurality of trenches include a first set of trenches and a second set of trenches that intersect the first set in a manner to form a plurality of protrusions each having a midlevel boundary with a generally square shape.

14. The spatula of claim 8, further comprising a plurality of holes that enable gas to flow between the lower surface of the substrate and space beneath the spatula.

15. The spatula of claim 8, further comprising an uneven lower surface that is substantially similar to the uneven upper surface so as to reduce the likelihood of asymmetrical thermal stress.

16. A method of supporting and moving a substrate between laterally adjacent areas, comprising:
    providing a spatula to extend beneath the substrate, the spatula having a portion with an upper surface having a plurality of spaced protrusions extending upwardly to engage a lower surface of the substrate, said protrusions extending upwardly from a plurality of channels that are open to the periphery of the spatula to enable gas to flow between the spatula and the substrate to facilitate separation of the substrate from the spatula; and
    connecting the spatula to a robotic arm in a manner to enable a forward end of the spatula to be controllably displaced to transport a substrate.

17. A spatula for moving a substrate, said spatula comprising an element having an upper surface with a plurality of intersecting channels and a plurality of uniformly distributed protrusions extending upwardly from the channels, said protrusions being arranged so that a substrate can be positioned on the spatula with the lower surface of the substrate uniformly supported by the protrusions and with the channels allowing gas to flow adjacent the lower surface of the substrate; said element having a lower surface that is substantially similar to the upper surface so as to reduce the likelihood of asymmetrical thermal stress.

* * * * *